(12) United States Patent
Oya et al.

(10) Patent No.: US 8,309,984 B2
(45) Date of Patent: Nov. 13, 2012

(54) NITRIDE-BASED SEMICONDUCTOR DEVICE HAVING ELECTRODE ON M-PLANE

(75) Inventors: Mitsuaki Oya, Aichi (JP); Toshiya Yokogawa, Nara (JP); Atsushi Yamada, Osaka (JP); Ryou Kato, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/167,865

(22) Filed: Jun. 24, 2011

(65) Prior Publication Data

US 2011/0248308 A1    Oct. 13, 2011

Related U.S. Application Data

(63) Continuation of application No. 12/936,960, filed as application No. PCT/JP2010/001653 on Mar. 9, 2010.

(30) Foreign Application Priority Data

Mar. 11, 2009    (JP) .................................. 2009-058272

(51) Int. Cl.
*H01L 33/00*    (2010.01)
(52) U.S. Cl. .............. 257/99; 257/79; 257/94; 257/100; 257/103; 257/E33.025; 257/E33.028; 257/E33.03; 257/E33.033; 257/E33.034; 257/E33.062; 257/E33.063
(58) Field of Classification Search .................... 257/94, 257/98, 99, 103, 79, 100, E33.025, E33.028, 257/E33.03, E33.033, E33.034, E33.062, 257/E33.063
See application file for complete search history.

(56) References Cited

U.S. PATENT DOCUMENTS

| | | | | |
|---|---|---|---|---|
| 5,990,500 | A | * | 11/1999 | Okazaki .......................... 257/99 |
| 6,242,761 | B1 | * | 6/2001 | Fujimoto et al. ................ 257/94 |
| 6,649,942 | B2 | | 11/2003 | Hata et al. |
| 2001/0024460 | A1 | | 9/2001 | Yamamoto et al. |
| 2008/0230766 | A1 | | 9/2008 | Okamoto et al. |
| 2008/0251781 | A1 | * | 10/2008 | Han et al. ........................ 257/13 |

FOREIGN PATENT DOCUMENTS

| | | |
|---|---|---|
| EP | 2 226 853 A1 | 9/2010 |
| JP | 07-011430 | 1/1995 |
| JP | 08-064871 | 3/1996 |
| JP | 10-294493 | 11/1998 |

(Continued)

OTHER PUBLICATIONS

International Search Report for corresponding International Application No. PCT/JP2010/001653 mailed Apr. 13, 2010.
Co-pending related U.S. Appl. No. 13/125,367, filed Apr. 21, 2011 (application provided).
International Search Report for related International Application No. PCT/JP2011/001027 mailed Apr. 5, 2011.

(Continued)

*Primary Examiner* — Jay C Kim
(74) *Attorney, Agent, or Firm* — Renner, Otto, Boisselle & Sklar, LLP

(57) ABSTRACT

A nitride-based semiconductor light-emitting device 100 includes a GaN substrate 10, of which the principal surface is an m-plane 12, a semiconductor multilayer structure 20 that has been formed on the m-plane 12 of the GaN-based substrate 10, and an electrode 30 arranged on the semiconductor multilayer structure 20. The electrode 30 includes an Mg alloy layer 32 which is formed of Mg and a metal selected from a group consisting of Pt, Mo, and Pd. The Mg alloy layer 32 is in contact with a surface of a p-type semiconductor region of the semiconductor multilayer structure 20.

12 Claims, 9 Drawing Sheets

FOREIGN PATENT DOCUMENTS

| | | |
|---|---|---|
| JP | 11-040846 | 2/1999 |
| JP | 11-274554 | 10/1999 |
| JP | 2000-277802 | 10/2000 |
| JP | 2001-160656 A | 6/2001 |
| JP | 2001-308462 | 11/2001 |
| JP | 2003-332697 | 11/2003 |
| JP | 2008-153285 | 7/2008 |
| JP | 2008-235804 | 10/2008 |
| JP | 2008-277323 | 11/2008 |
| JP | 2009-030147 | 2/2009 |
| JP | 2009-536554 | 8/2009 |
| WO | 2010/116703 A1 | 10/2010 |

OTHER PUBLICATIONS

Form PCT/ISA/237 for related International Application No. PCT/JP2011/001027 dated Apr. 5, 2011.

Co-pending related U.S. Appl. No. 12/679,347, filed Mar. 22, 2010 (application provided) (corresponds to JP 2009-536554 and JP 2009-030147.

Office Action for related U.S. Appl. No. 12/936,960 mailed Jan. 17, 2012.

Office Action for related U.S. Appl. No. 12/936,960 mailed Mar. 12, 2012.

* cited by examiner

○ N
● Ga (a)

(b)

(c)

NITRIDE-BASED SEMICONDUCTOR DEVICE HAVING ELECTRODE ON M-PLANE

TECHNICAL FIELD

The present invention relates to a nitride-based semiconductor device and a method for fabricating such a device. More particularly, the present invention relates to a GaN-based semiconductor light-emitting device such as a light-emitting diode or a laser diode that operates at wavelengths over the ultraviolet range and the entire visible radiation range, which covers blue, green, orange and white parts of the spectrum. Such a light-emitting device is expected to be applied to various fields of technologies including display, illumination and optical information processing in the near future. The present invention also relates to a method of making an electrode for use in such a nitride-based semiconductor device.

BACKGROUND ART

A nitride semiconductor including nitrogen (N) as a Group V element is a prime candidate for a material to make a short-wave light-emitting device because its bandgap is sufficiently wide. Among other things, gallium nitride-based compound semiconductors (which will be referred to herein as "GaN-based semiconductors" and which are represented by the formula $Al_xGa_yIn_zN$ (where $0 \leq x, y, z \leq 1$ and $x+y+z=1$)) have been researched and developed particularly extensively. As a result, blue light-emitting diodes (LEDs), green LEDs, and semiconductor laser diodes made of GaN-based semiconductors have already been used in actual products (see Patent Documents 1 and 2, for example).

A GaN-based semiconductor has a wurtzite crystal structure. FIG. 1 schematically illustrates a unit cell of GaN. In an $Al_xGa_yIn_zN$ (where $0 \leq x, y, z \leq 1$ and $x+y+z=1$) semiconductor crystal, some of the Ga atoms shown in FIG. 1 may be replaced with Al and/or In atoms.

FIG. 2 shows four fundamental vectors $a_1$, $a_2$, $a_3$ and c, which are generally used to represent planes of a wurtzite crystal structure with four indices (i.e., hexagonal indices). The fundamental vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane".

In fabricating a semiconductor device using GaN-based semiconductors, a c-plane substrate, i.e., a substrate of which the principal surface is a (0001) plane, is used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, a piezoelectric field is generated in the InGaN quantum well of the active layer in the c-axis direction. Once such a piezoelectric field has been generated in the active layer, some positional deviation occurs in the distributions of electrons and holes in the active layer. Consequently, the internal quantum yield decreases, thus increasing the threshold current in a semiconductor laser diode and increasing the power dissipation and decreasing the luminous efficacy in an LED. Meanwhile, as the density of injected carriers increases, the piezoelectric field is screened, thus varying the emission wavelength, too.

Thus, to overcome these problems, it has been proposed that a substrate of which the principal surface is a non-polar plane such as a (10-10) plane that is perpendicular to the [10-10] direction and that is called an "m-plane" (m-plane GaN-based substrate) be used. As used herein, attached on the left-hand side of a Miller-Bravais index in the parentheses means a "bar" (a negative direction index). The "m-plane" is sometimes expressed as "M-plane". As shown in FIG. 2, the m-plane is parallel to the c-axis (i.e., the fundamental vector c) and intersects with the c-plane at right angles. On the m-plane, Ga atoms and nitrogen atoms are on the same atomic-plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above. The "m-plane" is a generic term that collectively refers to a family of planes including (10-10), (−1010), (1-100), (−1100), (01-10) and (0-110) planes.

Also, as used herein, the "X-plane growth" means epitaxial growth that is produced perpendicularly to the X plane (where X=c or m) of a hexagonal wurtzite structure. As for the X-plane growth, the X plane will be sometimes referred to herein as a "growing plane". A layer of semiconductor crystals that have been formed as a result of the X-plane growth will be sometimes referred to herein as an "X-plane semiconductor layer".

CITATION LIST

Patent Literature

Patent Document 1: Japanese Laid-Open Patent Publication No. 2001-308462
Patent Document 2: Japanese Laid-Open Patent Publication No. 2003-332697
Patent Document 3: Japanese Laid-Open Patent Publication No. 8-64871
Patent Document 4: Japanese Laid-Open Patent Publication No. 11-40846

SUMMARY OF INVENTION

Technical Problem

As described above, a GaN-based semiconductor device that has been grown on an m-plane substrate would achieve far more beneficial effects than what has been grown on a c-plane substrate but still has the following drawback. Specifically, a GaN-based semiconductor device that has been grown on an m-plane substrate has higher contact resistance than what has been grown on a c-plane substrate, which constitutes a serious technical obstacle to using such a GaN-based semiconductor device that has been grown on an m-plane substrate.

Under the circumstances such as these, the present inventors wholeheartedly carried out extensive research to overcome such a problem with the prior art that a GaN-based semiconductor device, grown on an m-plane as a non-polar plane, would have high contact resistance. As a result, we found an effective means for reducing the contact resistance.

It is therefore an object of the present invention to provide a structure and manufacturing process that will be able to reduce the contact resistance of a GaN-based semiconductor device that has been fabricated by producing a crystal growth on an m-plane substrate.

Solution to Problem

The first nitride-based semiconductor device of the present invention includes: a nitride-based semiconductor multilayer structure including a p-type semiconductor region, a surface of the p-type semiconductor region being an m-plane; and an electrode that is arranged on the p-type semiconductor region, wherein the p-type semiconductor region is made of an $Al_xIn_yGa_zN$ semiconductor (where $x+y+z=1$, $x\geq 0$, $y\geq 0$, and $z\geq 0$), and the electrode includes an Mg alloy layer which is in contact with the surface of the p-type semiconductor region and which is made of Mg and a metal selected from a group consisting of Pt, Mo, and Pd.

In one embodiment, the electrode includes the Mg alloy layer and a metal layer provided on the Mg alloy layer, and the metal layer is formed of a metal which is selected from Pt, Mo, and Pd and which is contained in the Mg alloy layer.

In one embodiment, the semiconductor multilayer structure includes an active layer which includes an $Al_aIn_bGa_cN$ layer (where $a+b+c=1$, $a\geq 0$, $b\geq 0$ and $c\geq 0$), the active layer being configured to emit light.

In one embodiment, the p-type semiconductor region is a p-type contact layer.

In one embodiment, the Mg alloy layer has a thickness of 0.1 nm to 5 nm.

In one embodiment, the thickness of the Mg alloy layer is equal to or smaller than that of the Pt layer.

In one embodiment, in the Mg alloy layer, a concentration of N is lower than a concentration of Ga.

In one embodiment, the nitride-based semiconductor device further includes a semiconductor substrate that supports the semiconductor multilayer structure.

A light source of the present invention includes: a nitride-based semiconductor light-emitting device; and a wavelength converter including a phosphor that converts a wavelength of light emitted from the nitride-based semiconductor light-emitting device, wherein the nitride-based semiconductor light-emitting device includes a nitride-based semiconductor multilayer structure including a p-type semiconductor region, a surface of the p-type semiconductor region being an m-plane, and an electrode that is arranged on the p-type semiconductor region, the p-type semiconductor region is made of an $Al_xIn_yGa_zN$ semiconductor (where $x+y+z=1$, $x\geq 0$, $y\geq 0$, and $z\geq 0$), and the electrode includes an Mg alloy layer which is in contact with the surface of the p-type semiconductor region and which is made of Mg and a metal selected from a group consisting of Pt, Mo, and Pd.

A nitride-based semiconductor device fabrication method of the present invention includes the steps of: (a) providing a substrate; (b) forming on the substrate a nitride-based semiconductor multilayer structure including a p-type semiconductor region, a surface of the p-type semiconductor region being an m-plane; and (c) forming an electrode on the surface of the p-type semiconductor region of the semiconductor multilayer structure, wherein step (c) includes forming an Mg alloy layer on the surface of the p-type semiconductor region, the Mg alloy layer being made of Mg and a metal selected from a group consisting of Pt, Mo, and Pd.

In one embodiment, the step of forming the Mg alloy layer includes forming an Mg layer on the surface of the p-type semiconductor region, forming on the Mg layer a conductive layer selected from a group consisting of Pt, Mo, and Pd, and performing a heat treatment to alloy the Mg layer and at least part of the conductive layer.

In one embodiment, the heat treatment is performed at a temperature of 500° C. to 700° C.

In one embodiment, the heat treatment is performed at a temperature of 550° C. to 650° C.

In one embodiment, the step of forming the Mg layer includes irradiating Mg with pulses of an electron beam such that Mg is deposited onto the surface of the p-type semiconductor region.

In one embodiment, the Mg layer is deposited on the semiconductor multilayer structure so as to have a thickness of 0.1 nm to 5 nm.

In one embodiment, the method further includes removing the substrate after step (b).

In one embodiment, the step of forming the Mg alloy layer includes depositing a mixture or compound of Mg and a metal selected from a group consisting of Pt, Mo, and Pd onto the surface of the p-type semiconductor region by means of evaporation, and performing a heat treatment.

The second nitride-based semiconductor device of the present invention includes: a nitride-based semiconductor multilayer structure including a p-type semiconductor region, a surface of the p-type semiconductor region being an en-plane; and an electrode that is arranged on the p-type semiconductor region, wherein the p-type semiconductor region is made of an $Al_xIn_yGa_zN$ semiconductor (where $x+y+z=1$, $x\geq 0$, $y\geq 0$ and $z\geq 0$), and the electrode includes an Mg alloy island provided on the surface of the p-type semiconductor region, the Mg alloy island being made of Mg and a metal selected from a group consisting of Pt, Mo, and Pd.

In one embodiment, the electrode includes the Mg alloy island and a metal layer provided on the Mg alloy island, and the metal layer is formed of a metal which is selected from Pt, Mo, and Pd and which is contained in the Mg alloy island.

Advantageous Effects of Invention

In a nitride-based semiconductor device according to the present invention, an electrode on a semiconductor multilayer structure includes an Mg alloy layer that is in contact with the surface (which is an m-plane) of a p-type impurity region. As a result, the contact resistance can be reduced.

DESCRIPTION OF EMBODIMENTS

Figure 1:
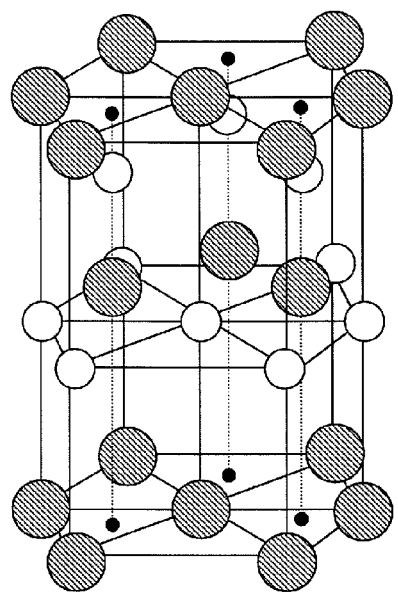
FIG. 1 is a perspective view schematically illustrating a unit cell of GaN.
Figure 1:
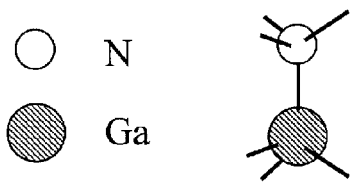
Figure 2:
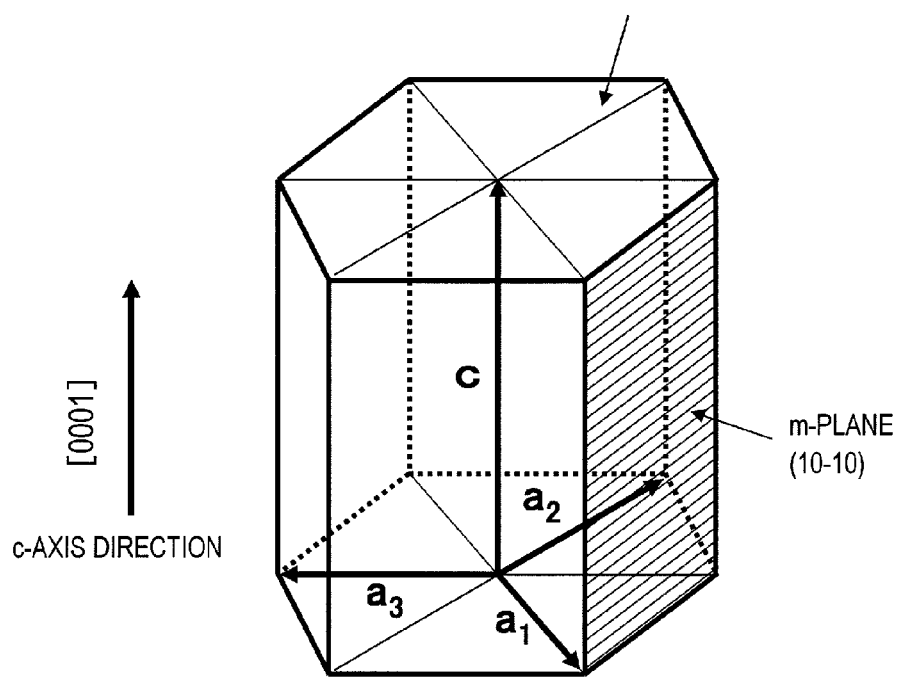
FIG. 2 is a perspective view showing four fundamental vectors $a_1$, $a_2$, $a_3$ and c representing a wurtzite crystal structure.

Hereinafter, preferred embodiments of the present invention will be described with reference to the accompanying drawings. In the drawings, any elements shown in multiple drawings and having substantially the same function will be identified by the same reference numeral for the sake of simplicity. It should be noted, however, that the present invention is in no way limited to the specific preferred embodiments to be described below.

Figure 3:
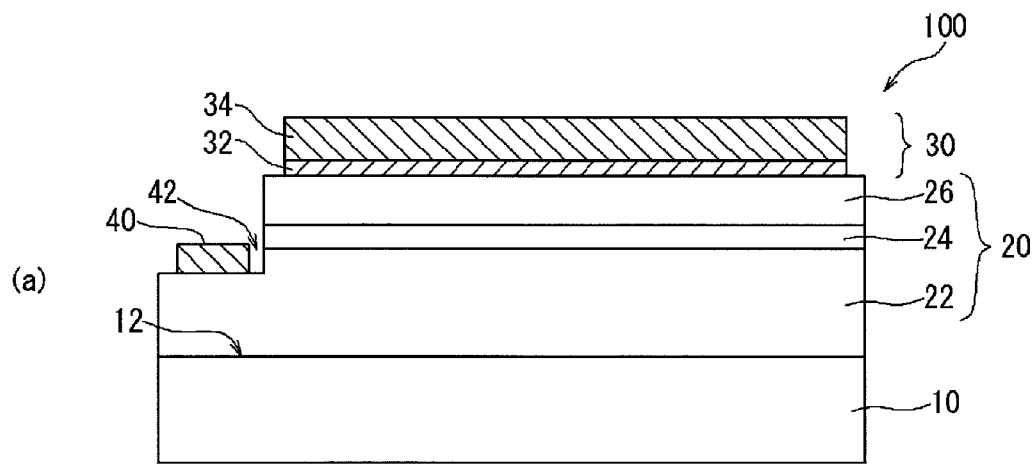
FIG. 3(a) is a schematic cross-sectional view illustrating a nitride-based semiconductor light-emitting device 100 as a preferred embodiment of the present invention.
FIGS. 3(b) and 3(c) illustrate the crystal structures of an m-plane and a c-plane, respectively.
Figure 3:
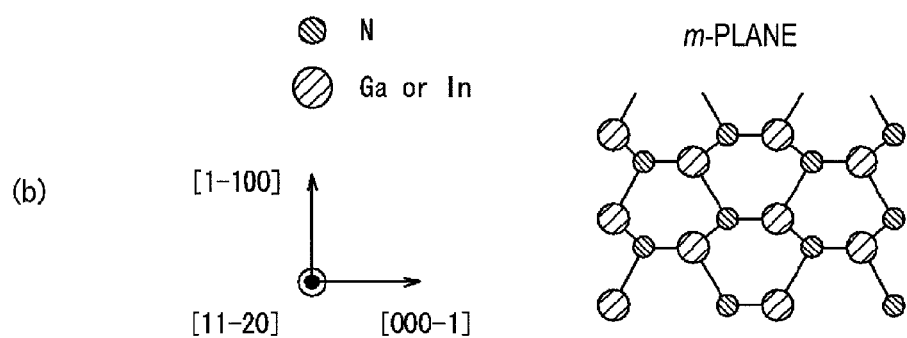
Figure 3:
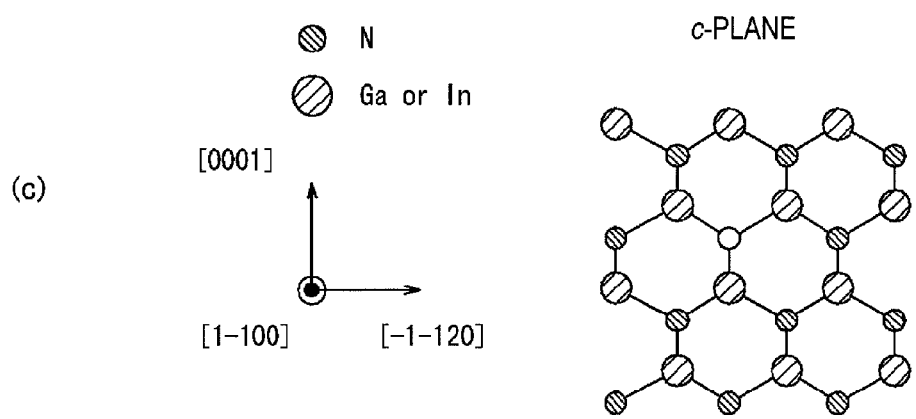

FIG. 3(a) schematically illustrates the cross-sectional structure of a nitride-based semiconductor light-emitting device 100 as a preferred embodiment of the present invention. What is illustrated in FIG. 3(a) is a semiconductor device made of GaN semiconductors and has a nitride-based semiconductor multilayer structure.

The nitride-based semiconductor light-emitting device 100 of this preferred embodiment includes a GaN-based substrate 10, of which the principal surface 12 is an m-plane, a semiconductor multilayer structure 20 that has been formed on the GaN-based substrate 10, and an electrode 30 arranged on the semiconductor multilayer structure 20. In this preferred embodiment, the semiconductor multilayer structure 20 is an m-plane semiconductor multilayer structure that has been formed through an m-plane crystal growth and its principal surface is an m-plane. It should be noted, however, that a-plane GaN could grow on an r-plane sapphire substrate in some instances. That is why according to the growth conditions, the principal surface of the GaN-based substrate 10 does not always have to be an m-plane. In the semiconductor multilayer structure 20 of the present invention, at least the surface of its p-type semiconductor region that is in contact with an electrode needs to be an m-plane.

The nitride-based semiconductor light-emitting device 100 of this preferred embodiment includes the GaN-based substrate 10 to support the semiconductor multilayer structure 20. However, the device 100 may have any other substrate instead of the GaN-based substrate 10 and could also be used without the substrate.

FIG. 3(b) schematically illustrates the crystal structure of a nitride-based semiconductor, of which the principal surface is an m-plane, as viewed on a cross section thereof that intersects with the principal surface of the substrate at right angles.

Since Ga atoms and nitrogen atoms are present on the same atomic-plane that is parallel to the m-plane, no electrical polarization will be produced perpendicularly to the m-plane. That is to say, the m-plane is a non-polar plane and no piezoelectric field will be produced in an active layer that grows perpendicularly to the m-plane. It should be noted that In and Al atoms that have been added will be located at Ga sites and will replace the Ga atoms. Even if at least some of the Ga atoms are replaced with those In or Al atoms, no electrical polarization will still be produced perpendicularly to the m-plane.

Such a GaN-based substrate, of which the principal surface is an m-plane, will be referred to herein as an "m-plane GaN-based substrate". To obtain a nitride-based semiconductor multilayer structure that has grown perpendicularly to the m-plane, typically such an m-plane GaN substrate may be used and semiconductors may be grown on the m-plane of that substrate. However, the principal surface of the substrate does not have to be an m-plane as described above, and the device as a final product could already have its substrate removed.

The crystal structure of a nitride-based semiconductor, of which the principal surface is a c-plane, as viewed on a cross section thereof that intersects with the principal surface of the substrate at right angles is illustrated schematically in FIG. 3(c) just for a reference. In this case, Ga atoms and nitrogen atoms are not present on the same atomic-plane, and therefore, electrical polarization will be produced perpendicularly to the c-plane. Such a GaN-based substrate, of which the principal surface is a c-plane, will be referred to herein as a "c-plane GaN-based substrate".

A c-plane GaN-based substrate is generally used to grow GaN-based semiconductor crystals thereon. In such a substrate, a Ga (or In) atom layer and a nitrogen atom layer that extend parallel to the c-plane are slightly misaligned from each other in the c-axis direction, and therefore, electrical polarization will be produced in the c-axis direction.

Referring to FIG. 3(a) again, on the principal surface (that is an m-plane) 12 of the m-plane GaN-based substrate 10, the semiconductor multilayer structure 20 is formed. The semiconductor multilayer structure 20 includes an active layer 24 including an $Al_aIn_bGa_cN$ layer (where $a+b+c=1$, $a \geqq 0$, $b \geqq 0$ and $c \geqq 0$), and an $Al_dGa_eN$ layer (where $d+e=1$, $d \geqq 0$ and $e \geqq 0$) 26, which is located on the other side of the active layer 24 opposite to the m-plane 12. In this embodiment, the active layer 24 is an electron injection region of the nitride-based semiconductor light-emitting device 100.

The semiconductor multilayer structure 20 of this preferred embodiment has other layers, one of which is an $Al_uGa_vIn_wN$ layer (where $u+v+w=1$, $u \geqq 0$, $v \geqq 0$ and $w \geqq 0$) 22 that is arranged between the active layer 24 and the substrate 10. The $Al_uGa_vIn_wN$ layer 22 of this preferred embodiment has first conductivity type, which may be n-type, for example. Optionally, an undoped GaN layer could be inserted between the active layer 24 and the $Al_dGa_eN$ layer 26.

In the $Al_dGa_eN$ layer 26, the mole fraction d of Al does not have to be uniform, but could vary either continuously or stepwise, in the thickness direction. In other words, the $Al_dGa_eN$ layer 26 could have a multilayer structure in which a number of layers with mutually different Al mole fractions d are stacked one upon the other, or could have its dopant concentration varied in the thickness direction. To reduce the contact resistance, the uppermost portion of the $Al_dGa_eN$ layer 26 (i.e., the upper surface region of the semiconductor multilayer structure 20) is preferably a layer that has an Al mole fraction d of zero (i.e., a GaN layer).

An electrode 30 has been formed on the semiconductor multilayer structure 20. The electrode 30 of this embodiment may be an electrode including an Mg alloy layer 32 that is made of Pt and Mg. Provided on the Mg alloy layer 32 is a metal layer 34 made of Pt. Here, "Mg alloy layer" refers to an Mg layer in which a metal, such as Pt, is contained at a concentration of at least a few percent (which may be equal to or greater than one percent). In the present embodiment, the Mg alloy layer 32 contains Pt, which is a metal that is a constituent of the metal layer 34, at a concentration of at least a few percent.

In the electrode 30, the Mg alloy layer 32 is in contact with the p-type semiconductor region of the semiconductor multilayer structure 20 and functions as a portion of a p-(or p-side) electrode. In this preferred embodiment, the Mg alloy layer 32 is in contact with the $Al_dGa_eN$ layer 26 that is doped with a dopant of a second conductivity type (e.g., p-type), which may be Mg. Examples of other preferred p-type dopants include Zn and Be.

The metal layer 34 that is in contact with the surface of the Mg alloy layer 32 is not limited to a Pt layer but may also be a layer of a metal that would make an alloy with Mg less easily than Au (gold). In other words, at least one type of metal selected from the group consisting of Pt, Mo, and Pd may be used. As the material of the metal layer 34 that is in contact with the surface of the Mg alloy layer 32, Au is not preferred because it would readily be alloyed with Mg. Pt, Mo, and Pd are metals that are less likely to be alloyed with Mg than Au is but may react with part of Mg to form an alloy layer by means of a heat treatment which will be described later.

The Mg alloy layer 32 is preferably formed by depositing a metal layer of, for example, Pt, on an Mg layer and thereafter performing a heat treatment on the resultant structure. If the metal layer deposited before the heat treatment is relatively thick, there is a remaining metal layer 34 on the Mg alloy layer 32 formed by the heat treatment. On the other hand, if the metal layer deposited before the heat treatment is relatively thin, the metal layer 34 may be entirely alloyed with Mg by the heat treatment. In this case, the electrode 30 is constituted only of the Mg alloy layer 32.

Note that the Mg alloy layer 32 may be formed by performing a vapor deposition using a mixture or compound of a metal that is to be a constituent of the metal layer 34 and Mg as a source material and thereafter performing a heat treatment on the resultant structure. In this case, immediately after the Mg alloy layer 32 has been deposited, the metal layer 34 does not exist on the Mg alloy layer 32. Thereafter, the metal layer 34 may not be deposited on the Mg alloy layer 32, so that the electrode 30 is constituted only of the Mg alloy layer 32. Alternatively, the metal layer 34 may be deposited on the Mg alloy layer 32 when necessary.

At least part of the Mg alloy layer 32 may undergo aggregation to form islands due to a heat treatment performed after the deposition, so that the islands are separated from one another with spaces. In this case, Pt atoms that constitute the metal layer 34 intervene between the respective islands of the Mg alloy. At least part of the metal layer 34 may undergo aggregation to form islands.

On any of the above-described electrode, together with the above-described metal layer or alloy layer, any electrode layer or wire layer made of a different metal or alloy may be provided.

The thickness of the electrode 30 of the present embodiment is, for example, 1 nm to 200 nm. In the case where the metal layer 34 is provided on the Mg alloy layer 32, the thickness of the Mg alloy layer 32 is smaller than that of the metal layer 34. In this case, the thickness of the Mg alloy layer 32 is for example 5 nm or less (preferably, from 0.1 nm to 5 nm). When the thickness of the Mg layer deposited before the heat treatment is greater than 5 nm, part of the Mg layer is not alloyed by the heat treatment, so that there may be a remaining Mg layer between the Mg alloy layer 32 and the $Al_dGa_eN$ layer 26. This is because the metal that constitutes the metal layer 34, such as Pt, is less likely to be alloyed with Mg. If there is a remaining Mg layer, the adhesiveness with the underlying semiconductor multilayer structure 20 may be relatively low. In view of such, the thickness of the Mg layer deposited before the heat treatment is preferably 5 nm or less. The thickness of the Mg alloy layer 32 formed by the heat treatment is preferably 5 nm or less.

The thickness of the metal layer (e.g., Pt layer) 34 provided over the Mg alloy layer 32 is, for example, 200 nm or less (preferably, from 1 nm to 200 nm). The reason why the thickness of the Mg alloy layer 32 is smaller than that of the metal layer 34 is to prevent separation of the Mg alloy layer 32 and the $Al_dGa_eN$ layer 26 which would be caused due to disturbed balance of strain between the Mg alloy layer 32 and the metal layer 34. The metal layer 34 significantly contributes to, for example, prevention of oxidation of the Mg alloy layer 32, but is not absolutely indispensable.

Meanwhile, the GaN-based substrate 10, of which the principal surface 12 is an m-plane, may have a thickness of 100 μm to 400 μm, for example. This is because if the wafer has a thickness of at least approximately 100 μm, then there will be no trouble handling such a wafer. It should be noted that as long as the substrate 10 of this preferred embodiment has an m-plane principal surface 12 made of a GaN-based material, the substrate 10 could have a multilayer structure. That is to say, the GaN-based substrate 10 of this preferred embodiment could also refer to a substrate, at least the principal surface 12 of which is an m-plane. That is why the entire substrate could be made of a GaN-based material. Or the substrate may also be made of the GaN-based material and another material in any combination.

In the structure of this preferred embodiment, an electrode 40 has been formed as an n-side electrode on a portion of an n-type $Al_uGa_vIn_wN$ layer 22 (with a thickness of 0.2 μm to 2 μm, for example) which is located on the substrate 10. In the example illustrated in FIG. 3(a), in the region of the semiconductor multilayer structure 20 where the electrode 40 is arranged, a recess 42 has been cut so as to expose a portion of the n-type $Al_uGa_vIn_wN$ layer 22. And the electrode 40 has been formed on the exposed surface of the n-type $Al_uGa_vIn_wN$ layer 22 at the bottom of the recess 42. The electrode 40 may have a multilayer structure consisting of Ti, Al and Ti layers and may have a thickness of 100 nm to 200 nm, for example.

In this preferred embodiment, the active layer 24 has a GaInN/GaN multi-quantum well (MQW) structure (with a thickness of 81 nm, for example) in which $Ga_{0.9}In_{0.1}N$ well layers (each having a thickness of 9 nm, for example) and GaN barrier layers (each having a thickness of 9 nm, for example) are alternately stacked one upon the other.

On the active layer 24, stacked is the p-type $Al_dGa_eN$ layer 26, which may have a thickness of 0.2 μm to 2 μm. Optionally, an undoped GaN layer could be inserted between the active layer 24 and the $Al_dGa_eN$ layer 26 as described above.

In addition, a GaN layer of the second conductivity type (which may be p-type, for example) could be formed on the $Al_dGa_eN$ layer 26. Furthermore, a contact layer of $p^+$-GaN and the Mg alloy layer 32 could be stacked in this order on that GaN layer. In that case, the GaN contact layer could also be regarded as forming part of the $Al_dGa_eN$ layer 26, not a layer that has been stacked separately from the $Al_dGa_eN$ layer 26.

Figure 4A:
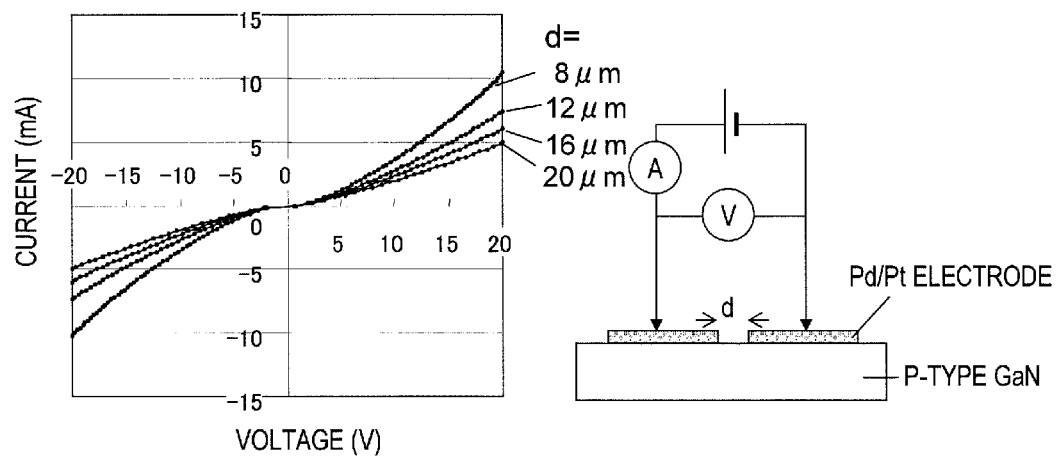
FIG. 4A shows the current-voltage characteristic under the condition that two Pd/Pt electrodes are in contact with a p-type GaN layer.
Figure 4B:
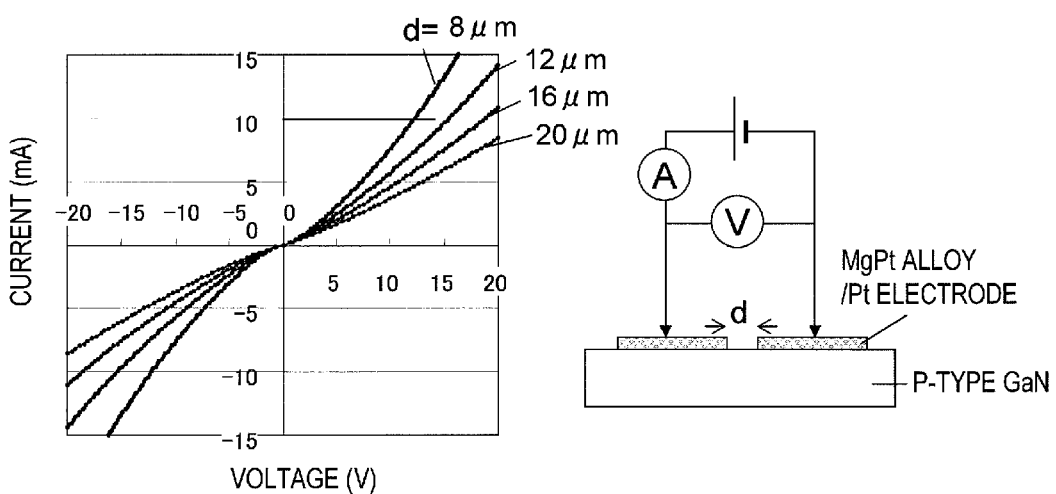
FIG. 4B shows the current-voltage characteristic under the condition that two Mg alloy layer electrodes are in contact with a p-type GaN layer.

FIG. 4A shows the current-voltage characteristic under the condition that two Pd/Pt electrodes are in contact with a p-type GaN layer. FIG. 4B shows the current-voltage characteristic under the condition that two Mg alloy layer electrodes are in contact with a p-type GaN layer. The Pd/Pt electrode used herein was an electrode (m-plane GaN (Pd/Pt)) formed by sequentially forming a Pd layer and a Pt layer in this order on a p-type m-plane GaN layer and thereafter performing a heat treatment on the resultant structure in a nitrogen atmosphere. The Mg alloy layer electrode used herein was an electrode (m-plane GaN (Mg—Pt alloy/Pt)) formed by sequentially depositing an Mg layer and a Pt layer in this order by means of evaporation on a p-type m-plane GaN layer and thereafter performing a heat treatment on the resultant structure in a nitrogen atmosphere such that Mg and Pt are alloyed. The structures and heat treatment conditions of these electrodes are shown below in TABLE 1.

TABLE 1

| Plane orientation | p-electrode | Thickness (before heat treatment) | Heat treatment temperature and duration |
|---|---|---|---|
| m-plane | Pd/Pt | Pd 40 nm/Pt 35 nm | 500° C., 10 min. |
| m-plane | Mg—Pt Alloy/Pt | Mg 2 nm/Pt 75 nm | 600° C., 10 min. |

In the present embodiment, the heat treatment described in TABLE 1 is performed such that the Mg layer, which is in contact with the p-type GaN layer, and part of the Pt layer (a side of the Pt layer which is in contact with the Mg layer) are alloyed. Further, the Mg alloy layer is heated while it is in contact with the p-type GaN layer, whereby an excellent Mg alloy layer electrode (Mg—Pt alloy/Pt electrode) can be formed.

Figure 4C:
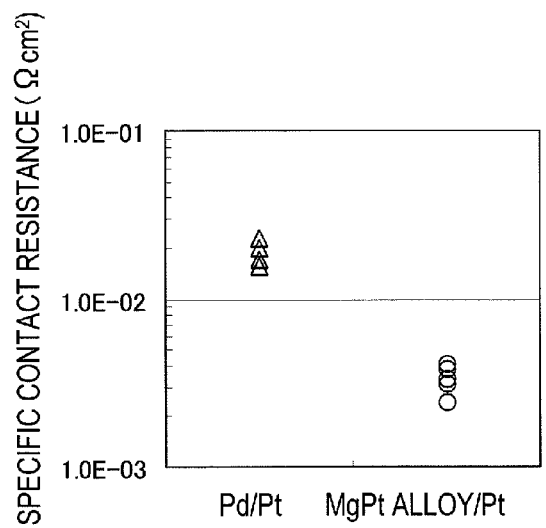
FIG. 4C is a graph which shows the specific contact resistances ($\Omega\cdot cm^2$) of the devices in which the above-described Pd/Pt electrode and Mg—Pt alloy/Pt electrode are respectively used.
Figure 4D:
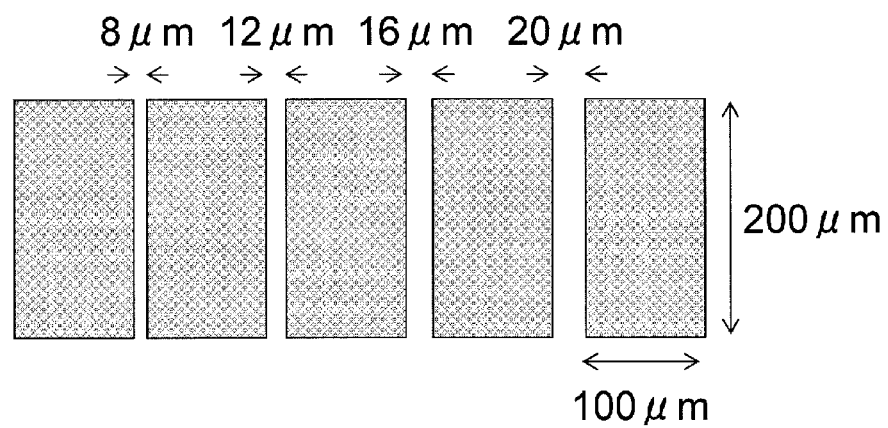
FIG. 4D is a pattern diagram of a TLM electrode.

The curves of the current-voltage characteristic shown in FIGS. 4A and 4B respectively correspond to the distances between electrodes of the TLM (Transmission Line Method) electrode pattern shown in FIG. 4D. FIG. 4D shows an arrangement of a plurality of electrodes of 100 μm×200 μm with the intervals of 8 μm, 12 μm, 16 μm, and 20 μm.

FIG. 4C is a graph which shows the specific contact resistances ($\Omega \cdot cm^2$) of the devices in which the above-described Pd/Pt electrode and Mg—Pt alloy/Pt electrode were respectively used. The contact resistance was evaluated using the TLM. Referring to the ordinate axis, "1.0E-01" means "1.0× $10^{-1}$", and "1.0E-02" means "1.0×$10^{-2}$". Hence, "1.0E+X" means "1.0×$10^X$".

Pd is a metal of a large work function, which has been conventionally used for the p-electrode. In the Pd/Pt electrode, Pd is in contact with the p-type GaN layer. The graph of FIG. 4A (the current-voltage characteristic of the Pd/Pt electrode) shows a Schottky-type non-ohmic characteristic (Schottky voltage: about 2 V). On the other hand, no Schottky voltage is seen in the graph of FIG. 4B (the current-voltage characteristic of the Mg alloy layer electrode). Thus, it can be understood that this Mg alloy layer electrode substantially forms an ohmic contact with the p-type GaN layer. Disappearance of the Schottky voltage is critical in decreasing the operating voltages of devices, such as light-emitting diodes, laser diodes, etc.

Further, as shown in FIG. 4C, the Mg—Pt alloy/Pt electrode exhibits a lower specific contact resistance ($\Omega \cdot cm^2$) than the Pd/Pt electrode by approximately one order of magnitude. The present embodiment successfully provides marvelous effects which would not be achieved by the conventional approach of using a metal of a large work function for the p-electrode.

Note that, when the Mg/Pt electrode is in contact with the c-plane p-type GaN layer, the contact resistance obtained is slightly lower than a case where the Pd/Pt electrode is used. When the contact surface is an m-plane, the Mg/Pt electrode exhibits a considerably lower contact resistance than the Pd/Pt electrode (see Japanese Patent Application No. 2009-536554). It is estimated that the present invention that uses the Mg—Pt alloy/Pt electrode would provide a similar result.

Next, the dependence of the contact resistance on the heat treatment temperature is described.

Figure 5:
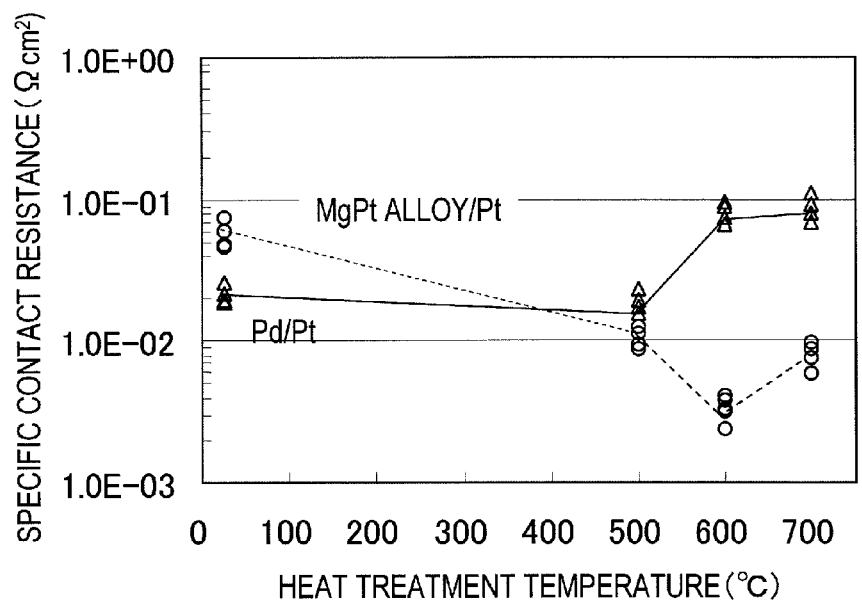
FIG. 5 is a graph which shows the dependence of the contact resistance on the heat treatment temperature.

FIG. 5 shows the result of an electrode formed by sequentially depositing an Mg layer and a Pt layer in this order by means of evaporation on the m-plane of a p-type GaN layer and thereafter performing a heat treatment on the resultant structure in a nitrogen atmosphere such that Mg and Pt are alloyed (i.e., m-plane GaN (Mg—Pt alloy/Pt)). FIG. 5 also shows, for comparison purposes, the result of an electrode formed by sequentially forming a Pd layer and a Pt layer in this order on a p-type m-plane GaN layer and thereafter performing a heat treatment on the resultant structure in a nitrogen atmosphere (m-plane GaN (Pd/Pt)).

The data shown in FIG. 5 were obtained from samples in which the Mg layer was deposited using a pulse evaporation process. The pulse evaporation process will be described later. In the experimental examples of the present invention which are described in the present specification, the Mg layer was deposited by the pulse evaporation process. Metals other than Mg (e.g., Pd, Pt, Au) were deposited using a common electron beam evaporation process.

The Mg—Pt alloy/Pt electrode and the Pd/Pt electrode are both in contact with the Mg-doped m-plane GaN layer. The m-plane GaN layer that is in contact with these electrodes is doped with 7×$10^{19}$ $cm^{-3}$ Mg to a depth of 20 nm as measured from the surface (i.e., the uppermost surface region with a thickness of 20 nm). On the other hand, the rest of the m-plane GaN layer, of which the depth exceeds 20 nm as measured from the surface, is doped with 1×$10^{19}$ $cm^{-3}$ Mg. If the concentration of the p-type dopant is locally increased in this manner in the uppermost surface region of the GaN layer that is in contact with the p-electrode, the contact resistance can be reduced to the lowest possible level. On top of that, by adopting such a doping scheme, the in-plane non-uniformity of the current-voltage characteristic can also be reduced. As a result, the variation in drive voltage between respective chips can also be reduced. That is why in every experimental example disclosed in this application, the surface region of the p-type GaN layer that is in contact with the electrode is doped with 7×$10^{19}$ $cm^{-3}$ Mg to a depth of 20 nm as measured from the surface, while the other deeper region is doped with 1×$10^{19}$ $cm^{-3}$ Mg.

The thicknesses of the respective layers before the heat treatment are shown below in TABLE 2.

TABLE 2

| Plane orientation | p-electrode | Thickness (before heat treatment) |
|---|---|---|
| m-plane | Mg—Pt Alloy/Pt | Mg 2 nm/Pt 75 nm |
| m-plane | Pd/Pt | Pd 40 nm/Pt 35 nm |

First, in the case of the Pd/Pt electrode, the contact resistance scarcely changed even after the heat treatment at 500°

C. When the heat treatment temperature exceeded 500° C., the contact resistance increased.

On the other hand, in the case of the Mg—Pt alloy/Pt electrode, when the heat treatment temperature was 500° C. or higher, the contact resistance sharply decreased. In the present embodiment, it is the Mg layer that is in contact with the p-type m-plane GaN layer before the heat treatment. However, the heat treatment at 500° C. or higher causes the Mg layer to be alloyed with the Pt layer, so that it is the Mg alloy layer that is in contact with the p-type m-plane GaN layer after the heat treatment. It is seen from FIG. 5 that, in the case of the m-plane GaN (Mg—Pt alloy/Pt) electrode, when the heat treatment temperature was 600° C., the contact resistance further decreased. When the heat treatment was performed at a further increased temperature, 700° C., the contact resistance was higher than that obtained when the heat treatment temperature was 600° C. but was smaller than the contact resistance obtained in the case of the conventional m-plane GaN (Pd/Pt) electrode.

Therefore, the heat treatment temperature for the Mg—Pt alloy/Pt electrode is preferably 500° C. or higher, for example. The upper limit of the heat treatment temperature is preferably 700° C. or less because, if it exceeds 700° C. to reach a predetermined temperature (e.g., 800° C.) or higher, deterioration in the film quality of the electrode and the GaN layer would increase. In addition, more preferably, the temperature range is from 550° C. to 650° C., in which the contact resistance further decreases.

Figure 6:
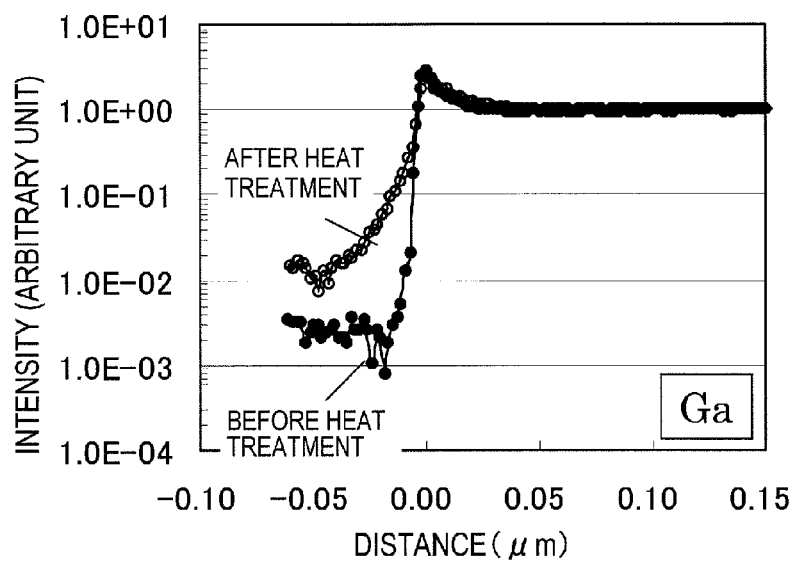
FIG. 6 shows a profile of Ga in the depth direction in an electrode structure (Mg/Pt) which was obtained by SIMS analysis.

FIG. 6 shows the profile of Ga in the depth direction in the electrode structure (Mg—Pt alloy/Pt) which was obtained using a SIMS. Before the heat treatment, the thickness of the Mg layer was 2 nm, and the thickness of the Pt layer was 75 nm. The heat treatment produced the Mg alloy layer which has a thickness of 2 nm. The heat treatment was performed at 600° C. in a nitrogen atmosphere for 10 minutes. The ordinate axis of the graph represents the signal intensity of the SIMS detector, which is proportional to the atomic concentration. In the abscissa axis of FIG. 6, Distance 0 µm approximately corresponds to the position of the interface between the p-type GaN layer and the Mg alloy layer. Note that the origin of the abscissa axis (0 µm) is adjusted to be coincident with the position of a Ga peak. As for the abscissa axis, the negative (−) value range is on the electrode side, and the positive (+) value range is on the p-type GaN side. The ordinate axis is normalized with the Ga concentration in as-deposited GaN crystals (before the heat treatment) being arbitrarily assumed as 1. Calculating from the atomic density of the base, the intensity of $1\times10^{-3}$ on the ordinate axis approximately corresponds to the concentration of $1\times10^{19}$ cm$^{-3}$.

As shown in FIG. 6, the Ga concentration in the Mg alloy layer after the heat treatment was higher than before the heat treatment. It is understood from this result that Ga was diffused into the Mg alloy layer by the heat treatment. Further, the sample that underwent the heat treatment at 500° C. or higher exhibited a decreased contact resistance, and hence, it was confirmed that there is some correlation between the amount of Ga diffused into the Mg alloy layer and the contact resistance, although the cause of the decrease in contact resistance is not specifically identified. It was also confirmed that, in the sample that exhibited the lowest contact resistance, the Ga concentration in the Mg alloy layer was $10^{19}$ cm$^{-3}$ or higher.

Figure 7:
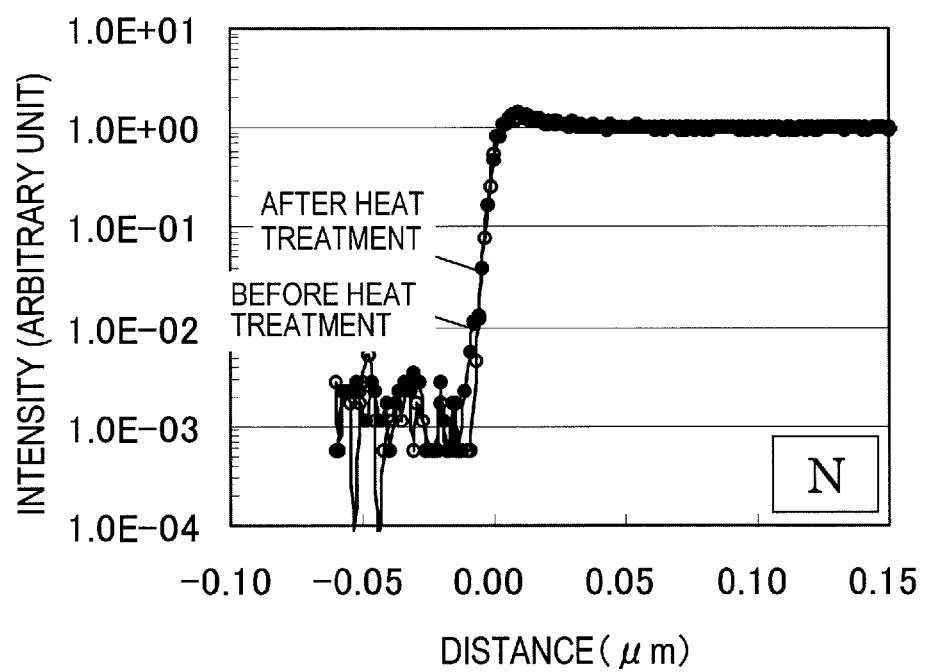
FIG. 7 shows a profile of N in the depth direction in an electrode structure (Mg/Pt) which was obtained by SIMS analysis.

FIG. 7 shows the profile of nitrogen atoms in the depth direction in the electrode structure (Mg—Pt alloy/Pt) which was obtained using a SIMS. Before the heat treatment, the thickness of the Mg layer was 2 nm, and the thickness of the Pt layer was 75 nm. The heat treatment produced the Mg alloy layer which has a thickness of 2 nm. The heat treatment was performed at 600° C. in a nitrogen atmosphere for minutes. In the graph of FIG. 7, the ordinate axis represents the N intensity, and the abscissa axis represents the distance in the depth direction. The N intensity of $1\times10^{-3}$ substantially corresponds to an N concentration of $1\times10^{19}$ cm$^{-3}$. In the abscissa axis, the negative (−) value range is on the electrode side, and the positive (+) value range is on the p-type GaN side. The ordinate axis is normalized with the N concentration in as-deposited GaN crystals (before the heat treatment) being arbitrarily assumed as 1. The origin of the abscissa axis (0 µm) approximately corresponds to the position of the interface between the p-type GaN layer and the Mg layer. As apparent from FIG. 7, even in the electrode structure after the heat treatment, diffusion of N into the Mg alloy layer was not confirmed.

As described above, the present inventor found that, when the heat treatment (at 600° C. in a nitrogen atmosphere for 10 minutes) is performed such that the Mg alloy layer is in contact with the m-plane surface of the p-type GaN layer, Ga atoms in the p-type GaN layer are diffused toward the electrode side, whereas N atoms are scarcely diffused toward the electrode side. As a result, the outermost surface of the p-type GaN layer is lacking Ga atoms, so that Ga vacancies are formed. The Ga vacancies have acceptor-like properties, and therefore, as the number of Ga vacancies increases in the vicinity of the interface between the electrode and the p-type GaN layer, holes more readily pass through the Schottky barrier of this interface by means of tunneling. Thus, it is estimated that the contact resistance would decrease when the Mg alloy layer is formed so as to be in contact with the m-plane surface of the p-type GaN layer.

On the other hand, the present inventor found that, when the heat treatment (at 600° C. in a nitrogen atmosphere for 10 minutes) is performed such that the Mg alloy layer is in contact with the c-plane surface, instead of the m-plane surface, of the p-type GaN layer, N atoms as well as Ga atoms are diffused toward the electrode side. Also, the present inventor confirmed that, in this case, the contact resistance is high. As N atoms as well as Ga atoms are diffused toward the electrode side, N vacancies that have donor-like properties are also formed in the outermost surface of the p-type GaN layer. As a result, at the outermost surface of the p-type GaN layer, charge compensation occurs between the Ga vacancies and the N vacancies. It is estimated that the omission of the N atoms would degrade the crystallinity of GaN crystals. It is inferred from such reasons that, when the Mg alloy layer is formed so as to be in contact with the c-plane surface of GaN, the contact resistance is high.

This finding teaches that the physical properties, such as interatomic bond strength, surface condition, etc., are totally different between the m-plane GaN and the c-plane GaN.

It is inferred that the behaviors of respective ones of such elements (Ga, N) occur even when some of Ga atoms are replaced by Al or In atoms in the GaN layer with which the Mg alloy layer is in contact. It is also inferred that the same applies even when the GaN-based semiconductor layer with which the Mg alloy layer is in contact is doped with an element other than Mg as a dopant.

Next, referring again to FIG. 3(a), the structure of the present embodiment is described in more detail.

As shown in FIG. 3(a), the light-emitting device 100 of the present embodiment includes the m-plane GaN substrate 10 and the Al$_u$Ga$_v$In$_w$N layer 22 (where u+v+w=1, u≧0, v≧0, w≧0) provided on the substrate 10. In this example, the m-plane GaN substrate 10 is an n-type GaN substrate (for example, 100 µm thick). The Al$_u$Ga$_v$In$_w$N layer 22 is an n-type GaN layer (for example, 2 μm thick). Provided on the $Al_uGa_vIn_wN$ layer 22 is an active layer 24. In other words, a semiconductor multilayer structure 20 including at least the active layer 24 is provided on the m-plane GaN substrate 10.

In the semiconductor multilayer structure 20, an active layer 24 including an $Al_aIn_bGa_cN$ layer (where a+b+c=1, a≧0, b≧0 and c≧0) has been formed on the $Al_xGa_yIn_zN$ layer 22. The active layer 24 consists of InGaN well layers with an In mole fraction of approximately 25% and GaN barrier layers, both the well layers and the barrier layers may have a thickness of 9 nm each, and the well layers may have a well layer period of three. On the active layer 24, stacked is an $Al_dGa_eN$ layer (where d+e=1, d≧0 and e≧0) 26 of the second conductivity type (which may be p-type, for example), which may be an AlGaN layer with an Al mole fraction of 10% and may have a thickness of 0.2 μm. In this preferred embodiment, the $Al_dGa_eN$ layer 26 is doped with Mg as a p-type dopant to a level of approximately $10^{18}$ $cm^{-3}$, for example. Also, in this example, an undoped GaN layer (not shown) is interposed between the active layer 24 and the $Al_dGa_eN$ layer 26.

Furthermore, in this example, on the $Al_dGa_eN$ layer 26, stacked is a GaN layer (not shown) of the second conductivity type (which may be p-type, for example). In addition, on the contact layer of $p^+$-GaN, stacked in this order are an Mg alloy layer 32 and a Pt layer 34. And this stack of the Mg alloy layer 32 and the Pt layer 34 is used as an electrode (i.e., a p-electrode) 30.

This semiconductor multilayer structure 20 further has a recess 42 that exposes the surface of the $Al_uGa_vIn_wN$ layer 22. And an electrode 40 (n-electrode) has been formed on the $Al_uGa_vIn_wN$ layer 22 at the bottom of the recess 42, which may have a width (or diameter) of 20 μm and a depth of 1 μm, for example. The electrode 40 may have a multilayer structure consisting of Ti, Al and Pt layers, which may have thicknesses of 5 nm, 100 nm and 10 nm, respectively.

The present inventors discovered that the nitride-based semiconductor light-emitting device 100 of this preferred embodiment could have an operating voltage Vop that was approximately 1.3 V lower than that of a conventional m-plane LED with a Pd/Pt electrode, and therefore, could cut down the power dissipation as a result.

Next, a method for fabricating the nitride-based semiconductor light-emitting device 100 of this embodiment is described while still referring to FIG. 3(a).

First of all, an m-plane substrate 10 is prepared. In this preferred embodiment, a GaN substrate is used as the substrate 10. The GaN substrate of this preferred embodiment is obtained by HVPE (hydride vapor phase epitaxy).

For example, a thick GaN film is grown to a thickness of several millimeters on a c-plane sapphire substrate, and then diced perpendicularly to the c-plane (i.e., parallel to the m-plane), thereby obtaining m-plane GaN substrates. However, the GaN substrate does not have to be prepared by this particular method. Alternatively, an ingot of bulk GaN may be made by a liquid phase growth process such as a sodium flux process or a melt-growth method such as an ammonothermal process and then diced parallel to the m-plane.

The substrate 10 does not have to be a GaN substrate but may also be a gallium oxide substrate, an SiC substrate, an Si substrate or a sapphire substrate, for example. To grow an m-plane GaN-based semiconductor on the substrate by epitaxy, the principal surface of the SiC or sapphire substrate is preferably also an m-plane. However, in some instances, a-plane GaN could grow on an r-plane sapphire substrate. That is why according to the growth conditions, the surface on which the crystal growth should take place does not always have to be an m-plane. In any case, at least the surface of the semiconductor multilayer structure 20 should be an m-plane. In this preferred embodiment, crystal layers are formed one after another on the substrate 10 by MOCVD (metalorganic chemical vapor deposition) process.

Next, an $Al_uGa_vIn_wN$ layer 22 is formed on the m-plane GaN substrate 10. As the $Al_uGa_vIn_wN$ layer 22, AlGaN may be deposited to a thickness of 3 μm, for example. A GaN layer may be deposited by supplying $TMG(Ga(CH_3)_3)$, $TMA(Al(CH_3)_3)$ and $NH_3$ gases onto the m-plane GaN substrate 10 at 1,100° C., for example.

Subsequently, an active layer 24 is formed on the $Al_uGa_vIn_wN$ layer 22. In this example, the active layer 24 has a GaInN/GaN multi-quantum well (MQW) structure in which $Ga_{0.9}In_{0.1}N$ well layers and GaN barrier layers, each having a thickness of 9 nm, have been stacked alternately to have an overall thickness of 81 nm. When the $Ga_{0.9}In_{0.1}N$ well layers are formed, the growth temperature is preferably lowered to 800° C. to introduce In.

Thereafter, an undoped GaN layer is deposited to a thickness of 30 nm, for example, on the active layer 24, and then an $Al_dGa_eN$ layer 26 is formed on the undoped GaN layer. As the $Al_dGa_eN$ layer 26, p-$Al_{0.14}Ga_{0.86}N$ is deposited to a thickness of 70 nm by supplying TMG, $NH_3$, TMA, TMI gases and $Cp_2Mg$ (cyclopentadienyl magnesium) gas as a p-type dopant.

Next, a p-GaN contact layer is deposited to a thickness of 0.5 μm, for example, on the $Al_dGa_eN$ layer 26. In forming the p-GaN contact layer, $Cp_2Mg$ is supplied as a p-type dopant.

Thereafter, respective portions of the p-GaN contact layer, the $Al_dGa_eN$ layer 26, the undoped GaN layer, and the active layer 24 are removed by performing a chlorine-based dry etching process, thereby making a recess 42 and exposing a region of the $Al_xGa_yIn_zN$ layer 22 where an n-electrode will be formed. Then, Ti/Pt layers are deposited as an n-electrode 40 on the region reserved for an n-type electrode at the bottom of the recess 42.

Then, an Mg layer (thickness: 2 nm) is formed on the p-GaN contact layer, and a Pt layer (thickness: 75 nm) is formed on the Mg layer. Thereafter, the resultant structure is subjected to a heat treatment at 600° C. in a nitrogen atmosphere for 10 minutes, so that part of the Pt layer which is on the Mg layer side encroaches upon the Mg layer, thereby forming the Mg alloy layer 32. The other part of the Pt layer which has not been alloyed with the Mg layer is remaining as the Pt layer 34 on the Mg alloy layer 32. The heat treatment of the present embodiment serves as both the heat treatment for formation of the Mg alloy layer and the heat treatment for diffusing Ga atoms of the p-type GaN layer toward the electrode side.

The present embodiment uses, for formation of the Mg layer, a pulse evaporation process in which deposition is performed while a material metal is evaporated in pulses. More specifically, metal Mg contained in a crucible in a vacuum is irradiated with pulses of electron beam, whereby the material metal is evaporated in pulses. Some of the molecules or atoms of that material metal are deposited on the p-GaN contact layer, whereby an Mg layer is formed. For example, those pulses may have a pulse width of 0.5 seconds and may be applied repeatedly at a frequency of 1 Hz. By adopting such a method, a dense film of high quality could be formed as the Mg layer. The Mg layer had such high density probably because, by performing such a pulse evaporation process, Mg atoms or a cluster of Mg atoms that collide against the p-GaN contact layer would have their kinetic energy increased.

Generally speaking, Mg is an element which is susceptible to oxidation when exposed to water or air. However, an Mg layer obtained by using the pulse evaporation process of the present embodiment is resistant to oxidation and exhibits excellent water resistance and oxygen resistance.

This preferred embodiment uses a technique for depositing a layer while evaporating the material metal (i.e., metal Mg) in pulses. However, as long as the Mg layer can be formed, any other technique can also be adopted. As an alternative method for forming such a dense Mg layer of quality, sputtering, a thermal CVD process, or a molecular beam epitaxy (MBE) could also be used.

Optionally, the substrate 10 and a portion of the $Al_uGa_vIn_wN$ layer 22 could be removed after that by some technique such as laser lift-off, etching or polishing. In that case, either only the substrate 10 or the substrate 10 and a portion of the $Al_uGa_vIn_wN$ layer 22 could be removed selectively. It is naturally possible to leave the substrate 10 and the $Al_uGa_vIn_wN$ layer 22 as they are without removing them. By performing these process steps, the nitride-based semiconductor light-emitting device 100 of this preferred embodiment is completed.

In the nitride-based semiconductor light-emitting device 100 of this preferred embodiment, when a voltage is applied to between the n- and p-electrodes 40 and 30, holes are injected from the p-electrode 30 into the active layer 24 and electrons are injected from the n-electrode 40 into the active layer 24, thus producing photoluminescence with a wavelength of about 450 nm.

Figure 8:
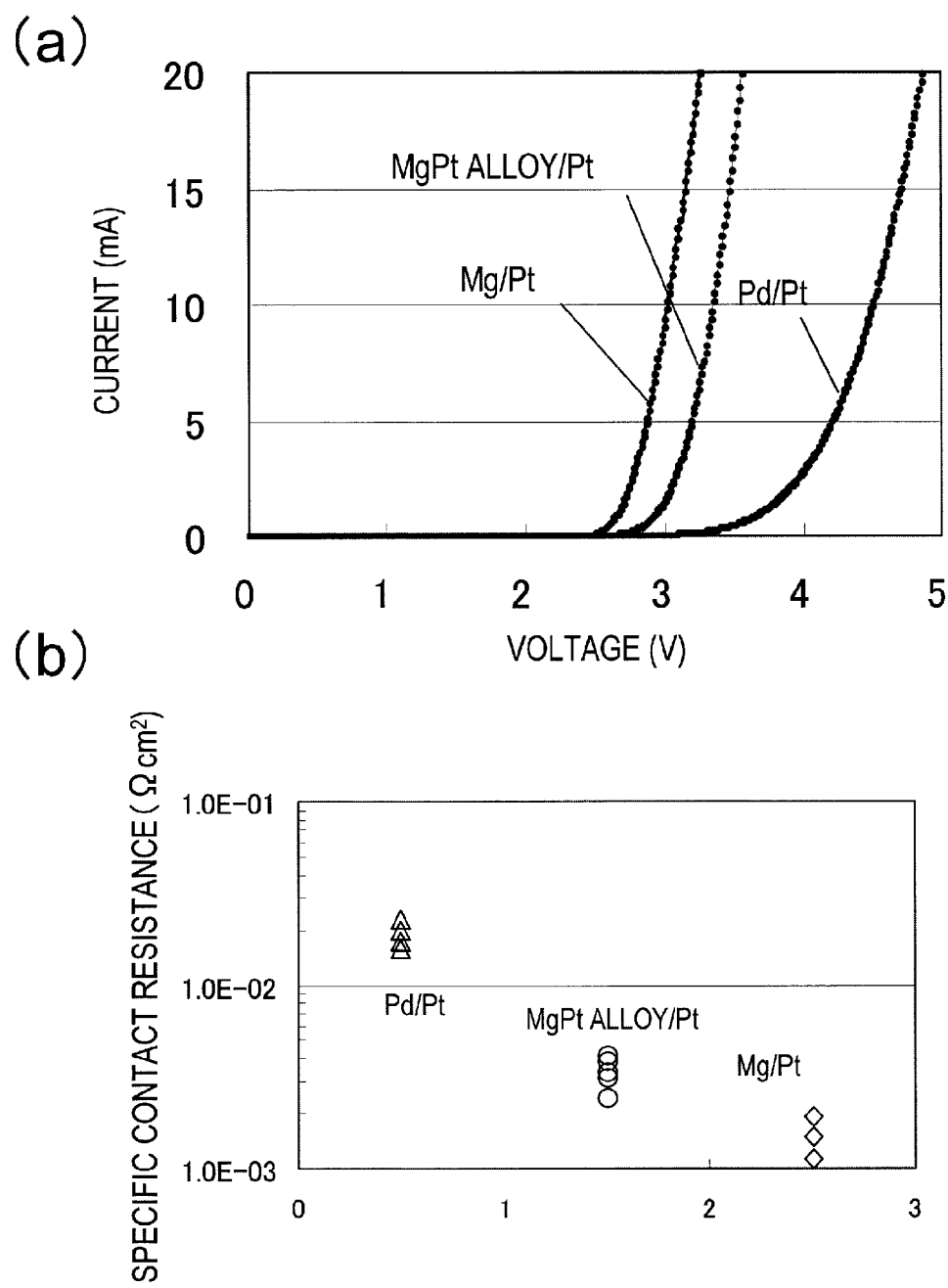
FIG. 8(a) shows the current-voltage characteristics of light-emitting diodes that respectively use an electrode consisting of Mg—Pt alloy/Pt layers, an electrode consisting of Mg/Pt layers, and an electrode consisting of Pt/Pd layers.
FIG. 8(b) is a graph showing the contact resistances of the light-emitting diodes.

FIG. 8(a) shows the current-voltage characteristic of a light-emitting diode that uses an electrode consisting of Mg—Pt alloy/Pt layers on m-plane GaN. For comparison purposes, the characteristics of light-emitting diodes (conventional examples) that have the same LED nitride-based semiconductor structure but that use an electrode consisting of Pd/Pt layers and an electrode consisting of Mg/Pt layers, respectively, are also shown in FIG. 8(a). The electrode structures and the heat treatment conditions for these light-emitting diodes are shown in TABLE 3.

TABLE 3

| Plane orientation | p-electrode | Thickness (before heat treatment) | Heat treatment temperature and duration |
| --- | --- | --- | --- |
| m-plane | Mg—Pt Alloy/Pt | Mg 2 nm/Pt 75 nm | 600° C., 10 min. |
| m-plane | Mg/Pt | Mg 7 nm/Pt 75 nm | 600° C., 10 min. |
| m-plane | Pd/Pt | Pd 40 nm/Pt 35 nm | 500° C., 10 min. |

In each of these light-emitting diodes, an n-type GaN layer, an active layer in which three InGaN well layers and two GaN barrier layers are alternately stacked one upon the other, and a p-type GaN layer are stacked in this order on an m-plane GaN substrate. In addition, either an Mg/Pt electrode or a Pd/Pt electrode is provided as a p-electrode on the p-type GaN layer. On the other hand, an n-electrode is formed on the n-type GaN layer by etching the p-type GaN layer and the active layer and exposing the n-type GaN layer.

First, a conventional electrode (an electrode of Pd/Pt layers) and an electrode of the present embodiment (an electrode of Mg—Pt alloy/Pt layers) are compared. The threshold voltage of a light-emitting diode which includes the electrode of Pd/Pt layers is about 3.2 V, whereas the threshold voltage of a light-emitting diode which includes the electrode of Mg—Pt alloy/Pt layers is about 2.7 V. That is, the threshold voltage of the present embodiment is smaller than that of the conventional device. It is understood from the comparison in terms of the operating voltage with the current value of 20 mA that the operating voltage of the light-emitting diode which includes the electrode of Mg—Pt alloy/Pt layers is lower than that of the light-emitting diode which includes the electrode of Pd/Pt layers by 1.3 V or more. Thus, the light-emitting diode which includes the electrode of the present embodiment is capable of greatly reducing the operating voltage as compared with the conventional diode.

Next, comparing the electrode of the present embodiment (the electrode of Mg—Pt alloy/Pt layers) and the electrode of Mg/Pt layers, the threshold voltage and the operating voltage for the current value of 20 mA of the light-emitting diode which includes the electrode of the present embodiment are somewhat larger than those of a light-emitting diode which includes the electrode of Mg/Pt layers.

FIG. 8(b) is a graph showing the contact resistances of the Mg—Pt alloy/Pt electrode, the Pd/Pt electrode, and the Mg/Pt electrode for comparison purposes. In any sample, the electrode is in contact with the p-type GaN layer.

The thicknesses of the respective layers before the heat treatment are shown below in TABLE 4.

TABLE 4

| Plane orientation | p-electrode | Thickness (before heat treatment) |
| --- | --- | --- |
| m-plane | Mg—Pt Alloy/Pt | Mg 2 nm/Pt 75 nm |
| m-plane | Pd/Pt | Pd 40 nm/Pt 35 nm |
| m-plane | Mg/Pt | Mg 7 nm/Pt 75 nm |

The temperature and duration of the heat treatment are shown below in TABLE 5.

TABLE 5

| Plane orientation | p-electrode | Heat treatment temperature and duration |
| --- | --- | --- |
| m-plane | Mg—Pt Alloy/Pt | 600° C., 10 min. |
| m-plane | Pd/Pt | 500° C., 10 min. |
| m-plane | Mg/Pt | 600° C., 10 min. |

As seen from FIG. 8(b), the contact resistance of the electrode of Mg—Pt alloy/Pt layers is lower than that of the electrode of Pd/Pt layers. The contact resistance of the electrode of Mg—Pt alloy/Pt layers is somewhat higher than that of the electrode of Mg/Pt layers.

As seen from the results shown in FIGS. 8(a) and 8(b), the electric characteristics (the characteristics of the threshold voltage and the operating voltage) and the contact resistance of the electrode of the present embodiment are somewhat inferior to those of the electrode of Mg/Pt layers. However, in terms of adhesiveness, the electrode of the present embodiment exhibits a superior characteristic to that of the electrode of Mg/Pt layers. Hence, it can be said that the electrode of the present embodiment is superior in terms of reliability.

Figure 9:
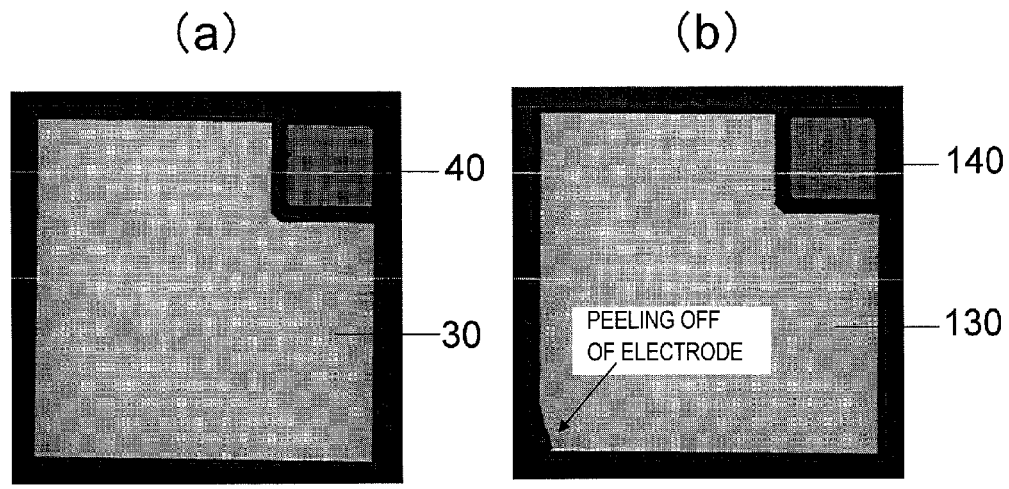
FIGS. 9(a) and 9(b) are light microscopic photographs of a surface of an electrode consisting of Mg—Pt alloy/Pt layers and a surface of an electrode consisting of Mg/Pt layers, which are presented as substitutes for drawings.

FIG. 9(a) is a light microscopic photograph of an electrode surface of a light-emitting device which includes the electrode of Mg—Pt alloy/Pt layers, which is presented as a substitute for a drawing. FIG. 9(b) is a light microscopic photograph of an electrode surface of a light-emitting device which includes the electrode of Mg/Pt layers, which is presented as a substitute for a drawing. In the light-emitting device which includes the electrode of Mg—Pt alloy/Pt layers, peeling off of the p-electrode 30 did not occur as shown in FIG. 9(a). In the light-emitting device which includes the electrode of Mg/Pt layers, peeling off was detected in part of an edge of the p-electrode 130 as shown in FIG. 9(b) in some samples. Note that FIG. 9(b) is a photograph of one of fabricated light-emitting device samples in which peeling off of the electrode was detected. It is not suggested that such peeling off of the electrode may occur with high probability in the devices which include the electrode of Mg/Pt layers.

Figure 10:
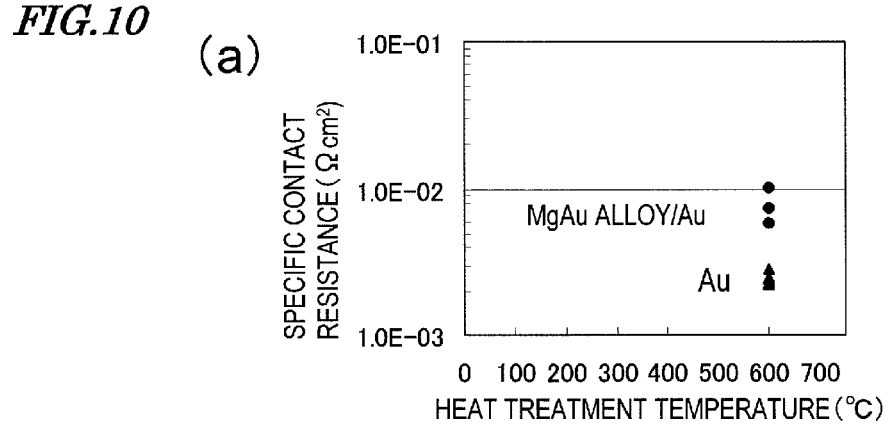
FIG. 10(a) is a graph showing the contact resistances of a device in which an electrode consisting of an Au layer is used and a device in which an electrode consisting of Mg—Au alloy/Au layers is used.
FIGS. 10(b) and 10(c) are light microscopic photographs of a surface of an electrode consisting of Mg—Au alloy/Au layers and a surface of an electrode consisting of an Au layer, which are presented as substitutes for drawings.
Figure 10:
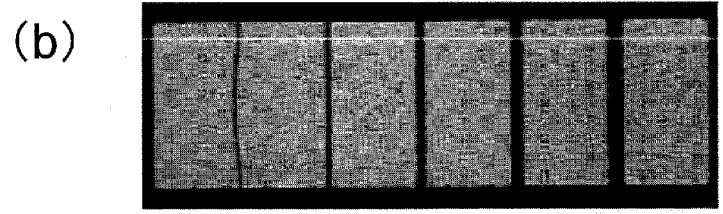
Figure 10:
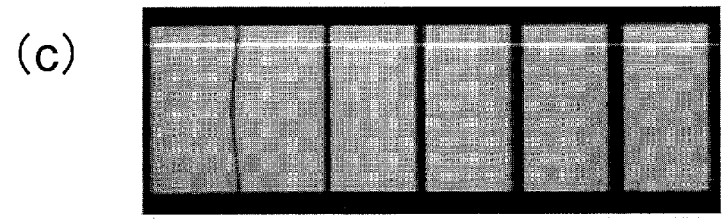

Next, examples that used an electrode consisting of an Au layer and an electrode consisting of Mg—Au alloy/Au layers will be described as comparative examples with reference to FIG. 10. Specifically, FIG. 10(a) shows the measured specific contact resistances ($\Omega \cdot cm^2$) of such an electrode consisting of an Au layer and such an electrode consisting of Mg—Au alloy/Au layers that were formed on an m-plane GaN layer. It should be noted that these specific contact resistances were measured after the electrode had been formed and thermally treated. The electrode of the Mg—Au alloy/Au layers was formed by forming a layered structure of an Mg layer and an Au layer and thereafter performing a heat treatment on the layered structure at 600° C. for 10 minutes. Since Mg and Au can readily be alloyed by a heat treatment, it is estimated that the Mg layer and the Au layer would be changed by the heat treatment into a layered structure of an Mg—Au alloy layer and an Au layer (i.e., Mg—Au alloy/Au layers).

As seen from the result of FIG. 10(a), the specific contact resistance characteristic is lower when the electrode of Mg—Au alloy/Au layers is used than when the electrode of an Au layer is used. Note that it was confirmed that the contact resistance of the electrode of the Au layer was substantially equal to that of the electrode of Pd/Pt layers. In is understood from the result of FIG. 10(a) that the electrode of Mg—Au alloy/Au layers exhibits a higher contact resistance than the electrode of Pd/Pt layers. In this respect, it is significantly different from the result, i.e., improved characteristic, of the electrode of the present embodiment (e.g., Mg—Pt alloy/Pt layers). Note that, as described above, Mg is an element which is susceptible to oxidation when exposed to water or air, and therefore, a multilayer configuration with an Au layer (Mg—Au alloy/Au layers after the heat treatment), rather than an electrode simply consisting of an Mg layer, can be one proposed structure. However, in actuality, the Mg—Au alloy/Au layers lead to a higher contact resistance than the Au layer and therefore lead to poor contact characteristics. In other words, the excellent contact resistance characteristic achieved by the configuration of the present embodiment (e.g., Mg—Pt alloy/Pt layers) would not have been anticipated by a person skilled in the art in view of the unfavorable measurement result of the electrode consisting of Mg—Au alloy and Au layers.

Note that, in the results shown in FIG. 10(a), in the Au electrode (or Pd/Pt electrode), the absolute value of the contract resistance is relatively low (not more than $3 \times 10^{-3}$ $\Omega \cdot cm^2$). This is because, in the m-plane GaN layer used in this experiment, the amount of implanted Mg dopant is optimized. However, measuring the current-voltage characteristic while two Au electrodes (or Pd/Pt electrodes) were in contact with the p-type GaN layer resulted in detection of a Schottky voltage. Thus, Au is not favorable for a material of an electrode which is to be in contact with the m-plane surface of the p-type GaN layer. On the other hand, the m-plane GaN layer was used to fabricate the electrode of the present embodiment (e.g., Mg—Pt alloy/Pt), and the contact resistance measured was $5 \times 10^{-4}$ $\Omega \cdot cm^2$ or less. Also, the electrode of the present embodiment was measured as to the current-voltage characteristic while the electrode was in contact with the p-type GaN layer, but a Schottky voltage was not detected. It was thus found that the electrode of the present embodiment and the p-type GaN layer with the m-plane surface formed an ohmic contact.

FIG. 10(b) is a photograph of a surface of the electrode of Mg—Au alloy/Au layers after the heat treatment, which is presented as a substitute for a drawing. On the other hand, FIG. 10(c) is a photograph of a surface of the electrode of the Au layer after the heat treatment, which is presented as a substitute for a drawing. Comparing these photographs, it was found that the electrode of Mg—Au alloy/Au layers had an inferior film quality.

While the present invention has been described with respect to preferred embodiments thereof, this invention is in no way limited to those specific preferred embodiments but could be modified in numerous ways and may assume many embodiments other than those specifically described above.

Even though its structure is essentially different from the preferred embodiment of the present invention, related structures are also disclosed in Patent Documents 3 and 4. However, those Patent Documents 3 and 4 do not mention at all that the crystallographic plane of their gallium nitride-based semiconductor layer is an m-plane but just disclose a technique for forming an electrode on a c-plane gallium nitride-based semiconductor layer. More specifically, Patent Document 3 discloses a structure in which an Au layer is stacked on an Mg layer. And even if an electrode with such a multilayer structure were formed on an m-plane, the effect of the electrode of this preferred embodiment would never be achieved. Meanwhile, Patent Document 4 mentions metal layers of Ni, Cr and Mg but discloses only a specific example about an electrode structure that uses an Ni layer as the lower layer. Both of these Patent Documents 3 and 4 relate to an electrode structure that has been formed on a c-plane gallium nitride-based semiconductor layer and teach neither a problem nor a solution about the contact resistance with respect to an m-plane gallium nitride-based semiconductor layer.

The present inventor also disclosed, in the earlier application (Japanese Patent Application No. 2009-030147), that an electrode configuration in which an Mg layer is in contact with an m-plane surface of a p-type GaN layer (Mg electrode) exhibits a low contact resistance. The contact resistance of the Mg alloy layer electrode of the present invention is higher than that of the electrode disclosed in the earlier application. However, as illustrated in FIG. 8(a), the effect of decreasing the operating voltage of a light-emitting diode which includes the Mg alloy layer electrode of the present invention is remarkably superior to that of the conventional Pd/Pt electrode. Also, the Mg alloy layer has a higher adhesiveness with the semiconductor multilayer structure than the Mg layer does and is therefore advantageous in improving the yields in mass production processes and improving the device reliability than the Mg electrode. There are several possible reasons for the high adhesiveness between the Mg alloy layer and the semiconductor multilayer structure. Addition of Pt (or Mo, Pd) to Mg increases the resistance to oxidation. Improvement in rigidity decreases the warpage due to strain. Pt (or Mo, Pd) contained in the Mg alloy layer is in contact with the semiconductor multilayer structure so that the adhesiveness is improved as compared with an electrode consisting of Mg only.

The light-emitting device of the present invention described above could be used as it is as a light source.

However, if the light-emitting device of the present invention is combined with a resin including a phosphor that produces wavelength conversion, for example, the device of the present invention can be used effectively as a light source with an expanded operating wavelength range (such as a white light source).

Figure 11:
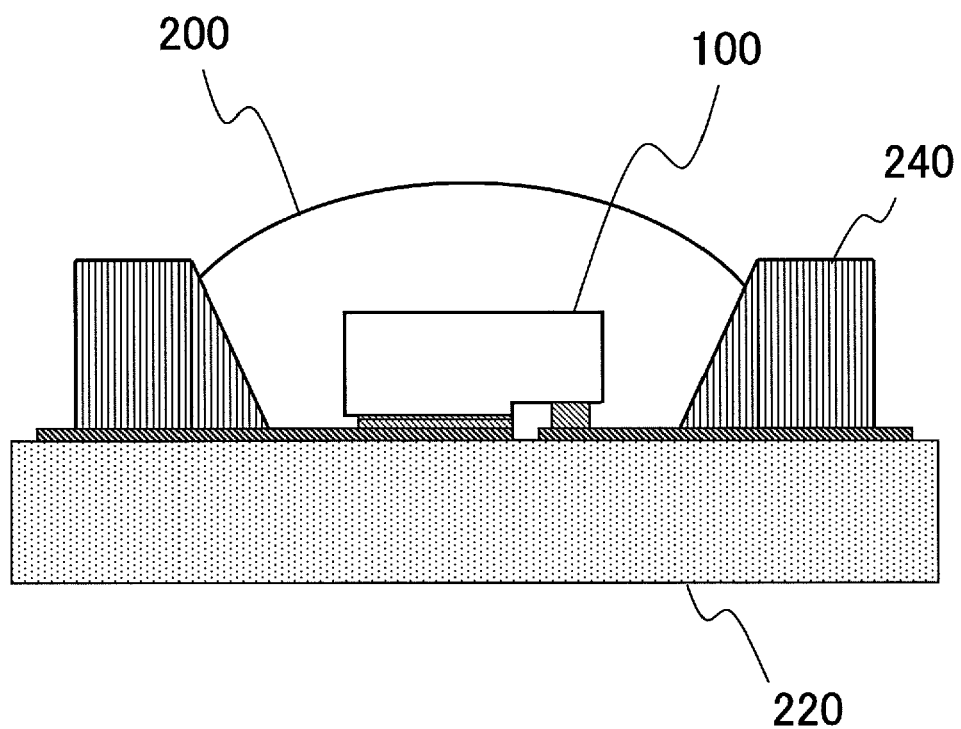
FIG. 11 is a cross-sectional view illustrating a preferred embodiment of a white light source.

FIG. 11 is a schematic representation illustrating an example of such a white light source. The light source shown in FIG. 11 includes a light-emitting device 100 with the structure shown in FIG. 3(a) and a resin layer 200 in which particles of a phosphor such as YAG (Yttrium Aluminum Garnet) are dispersed to change the wavelength of the light emitted from the light-emitting device 100 into a longer one. The light-emitting device 100 is mounted on a supporting member 220 on which a wiring pattern has been formed. And on the supporting member 220, a reflective member 240 is arranged so as to surround the light-emitting device 100. The resin layer 200 has been formed so as to cover the light-emitting device 100.

Note that the contact structure of the present invention provides the above-described excellent effects when the p-type semiconductor region that is in contact with the Mg layer is formed of a GaN-based semiconductor, specifically an $Al_xIn_yGa_zN$ semiconductor (x+y+z=1, x≧0, y≧0, z≧0). As a matter of course, such an effect of reducing the contact resistance can also be obtained in light-emitting devices other than LEDs (e.g., semiconductor lasers) and devices other than the light-emitting devices (e.g., transistors and photodetectors).

The actual m-plane does not always have to be a plane that is exactly parallel to an m-plane but may be slightly tilted from the m-plane by 0±1 degree.

INDUSTRIAL APPLICABILITY

According to the present invention, it is possible to reduce the contact resistance of a GaN-based semiconductor device fabricated by producing crystal growth on an m-plane substrate or a GaN-based semiconductor multilayer structure, of which the principal surface is an m-plane. As a result, although such a GaN-based semiconductor device fabricated by producing crystal growth on an m-plane substrate (or a GaN-based semiconductor multilayer structure, of which the principal surface is an m-plane) has been difficult to use extensively owing to its bad contact resistance characteristic, its industrial applicability can be expanded significantly by the present invention.

REFERENCE SIGNS LIST 10 substrate (GaN-based substrate)
12 surface of substrate (m-plane)
20 semiconductor multilayer structure
22 $Al_uGa_vIn_wN$ layer
24 active layer
26 $Al_dGa_eN$ layer
30 p-electrode
32 Mg alloy layer
34 metal layer (Pt layer)
40 n-electrode
42 recess
100 nitride-based semiconductor light-emitting device
200 resin layer
220 supporting member
240 reflective member

The invention claimed is:

1. A nitride-based semiconductor device, comprising:
a nitride-based semiconductor multilayer structure including a p-type semiconductor region, a surface of the p-type semiconductor region being an m-plane; and
an electrode that is arranged on the p-type semiconductor region,
wherein the p-type semiconductor region is made of an $Al_xIn_yGa_zN$ semiconductor (where x+y+z=1, x≧0, y≧0, and z≧0), and
the electrode includes a Mg alloy layer which is in contact with the surface of the p-type semiconductor region and which is made of Mg and a metal selected from a group consisting of Pt, Mo, and Pd, and
a contact resistance of the electrode arranged on the m-plane and annealed at a temperature of 500° C. to 700° C. is less than $1.0 \times 10^{-02}$ $\Omega cm^2$, and is lower than a contact resistance when the electrode is arranged on a c-plane of the same p-type semiconductor region and annealed at a temperature of 500° C. to 700° C.

2. The nitride-based semiconductor device of claim 1, wherein the p-type semiconductor region is a p-type GaN-based semiconductor region.

3. The nitride-based semiconductor device of claim 2, wherein
the electrode includes the Mg alloy layer and a metal layer provided on the Mg alloy layer, and
the metal layer is formed of a metal which is selected from Pt, Mo, and Pd and which is the same as the metal contained in the Mg alloy layer.

4. The nitride-based semiconductor device of claim 2, wherein the semiconductor multilayer structure includes an active layer which includes an $Al_aIn_bGa_cN$ layer (where a+b+c=1, a≧0, b≧0 and c≧0), the active layer being configured to emit light.

5. The nitride-based semiconductor device of claim 2, wherein the Mg alloy layer has a thickness of 0.1 nm to 5 nm.

6. The nitride-based semiconductor device of claim 3, wherein a thickness of the Mg alloy layer is equal to or smaller than a thickness of the metal layer.

7. The nitride-based semiconductor device of claim 2 wherein, in the Mg alloy layer, a concentration of N is lower than a concentration of Ga.

8. The nitride-based semiconductor device of claim 2, further comprising a semiconductor substrate that supports the semiconductor multilayer structure.

9. A light source, comprising:
the nitride-based semiconductor light-emitting device according to claim 2; and
a wavelength converter including a phosphor that converts a wavelength of light emitted from the nitride-based semiconductor light-emitting device.

10. A nitride-based semiconductor device, comprising:
a nitride-based semiconductor multilayer structure including a p-type semiconductor region, a surface of the p-type semiconductor region being an m-plane; and
an electrode that is arranged on the p-type semiconductor region,
wherein the p-type semiconductor region is made of an $Al_xIn_yGa_zN$ semiconductor (where x+y+z=1, x≧0, y≧0, and z≧0), and
the electrode includes a Mg alloy island provided on the surface of the p-type semiconductor region, the Mg alloy island being made of Mg and a metal selected from a group consisting of Pt, Mo, and Pd, and a contact resistance of the electrode arranged on the m-plane and annealed at a temperature of 500° C. to 700° C. is less than $1.0 \times 10^{-02}$ $\Omega cm^2$, and is lower than a contact resistance when the electrode is arranged on a c-plane of the same p-type semiconductor region and annealed at a temperature of 500° C. to 700° C.

11. The nitride-based semiconductor device of claim 10, wherein the p-type semiconductor region is a p-type GaN-based semiconductor region.

12. The nitride-based semiconductor device of claim 11, wherein the electrode includes the Mg alloy island and a metal layer provided on the Mg alloy island, and the metal layer is formed of a metal which is selected from Pt, Mo, and Pd and which is the same as the metal contained in the Mg alloy island.

* * * * *